US009431294B2

(12) United States Patent
He et al.

(10) Patent No.: US 9,431,294 B2
(45) Date of Patent: Aug. 30, 2016

(54) METHODS OF PRODUCING INTEGRATED CIRCUITS WITH AN AIR GAP

(71) Applicant: GLOBALFOUNDRIES, Inc., Grand Cayman, KY (US)

(72) Inventors: Ming He, Slingerlands, NY (US); Errol Todd Ryan, Clifton Park, NY (US); Roderick Alan Augur, Hopewell Junction, NY (US); Craig Child, Wilton, NY (US); Larry Zhao, Lake Oswego, OR (US)

(73) Assignee: GLOBALFOUNDRIES, INC., Grand Cayman (KY)

( * ) Notice: Subject to any disclaimer, the term of this patent is extended or adjusted under 35 U.S.C. 154(b) by 0 days.

(21) Appl. No.: 14/525,796

(22) Filed: Oct. 28, 2014

(65) Prior Publication Data

US 2016/0118292 A1    Apr. 28, 2016

(51) Int. Cl.
| | |
|---|---|
| *H01L 21/4763* | (2006.01) |
| *H01L 21/76* | (2006.01) |
| *H01L 21/768* | (2006.01) |
| *H01L 21/02* | (2006.01) |
| *H01L 23/532* | (2006.01) |
| *H01L 23/528* | (2006.01) |

(52) U.S. Cl.
CPC ....... *H01L 21/7682* (2013.01); *H01L 21/0217* (2013.01); *H01L 21/0228* (2013.01); *H01L 21/02274* (2013.01); *H01L 21/76802* (2013.01); *H01L 21/76831* (2013.01); *H01L 21/76834* (2013.01); *H01L 21/76877* (2013.01); *H01L 23/528* (2013.01); *H01L 23/5329* (2013.01); *H01L 23/53228* (2013.01)

(58) Field of Classification Search
CPC .................... H01L 21/7682; H01L 21/76831; H01L 21/76802; H01L 21/0217; H01L 23/53228; H01L 21/02274; H01L 21/76834; H01L 21/0228; H01L 23/528; H01L 23/5329; H01L 21/76877; H01L 21/76807; H01L 21/76826; H01L 2221/1074; H01L 21/764
USPC .................................. 438/619, 411, 421, 319
See application file for complete search history.

(56) References Cited

U.S. PATENT DOCUMENTS

| | | | | |
|---|---|---|---|---|
| 6,140,226 A | * | 10/2000 | Grill | ................. H01L 21/76811 257/E21.579 |
| 7,071,532 B2 | * | 7/2006 | Geffken | ............ H01L 21/76811 257/522 |
| 7,309,649 B2 | * | 12/2007 | Colburn | ............ H01L 21/76807 257/E21.438 |
| 7,329,602 B2 | * | 2/2008 | Wise | ................... H01L 21/7682 257/E21.577 |
| 7,605,071 B2 | * | 10/2009 | Torres | ................. H01L 21/7682 257/E21.17 |
| 7,662,722 B2 | * | 2/2010 | Stamper | ............. H01L 21/7682 438/702 |

* cited by examiner

*Primary Examiner* — Shouxiang Hu
(74) *Attorney, Agent, or Firm* — Ingrassia Fisher & Lorenz, P.C.

(57) ABSTRACT

Integrated circuits and methods for producing the same are provided. A method for producing an integrated circuit includes forming an interconnect trench in a dielectric layer, and forming a conformal barrier layer overlying the dielectric layer and within the interconnect trench. A barrier spacer is formed by removing the conformal barrier layer from an interconnect trench bottom, and an interconnect is formed within the interconnect trench after forming the barrier spacer. An air gap trench is formed in the dielectric layer adjacent to the barrier spacer, and a top cap is formed overlying the interconnect and the air gap trench, where the top cap bridges the air gap trench to produce an air gap in the air gap trench.

19 Claims, 5 Drawing Sheets

METHODS OF PRODUCING INTEGRATED CIRCUITS WITH AN AIR GAP

TECHNICAL FIELD

The technical field generally relates integrated circuits with an air gap and methods of producing the same, and more particularly relates to integrated circuits with an air gap between adjacent interconnects and methods of producing the same.

BACKGROUND

The semiconductor industry is continuously moving toward the fabrication of smaller and more complex microelectronic components with higher performance. The production of smaller integrated circuits requires the development of smaller electronic components, and closer spacing of those electronic components. Electromagnetic interference can degrade the performance of electronic components that are spaced too close together, but electronic components can be positioned closer together without disruptive interference when separated by an insulating material with a low dielectric constant.

Many materials have low dielectric constants, but a vacuum has the lowest dielectric constant. Gases, such as air, have very low dielectric constants and the dielectric constant of air is nearly the same as that of a vacuum. For example, vacuum has a dielectric constant of 1, and air at about 1 atmosphere has a dielectric constant of less than about 1.01. However, air or other gases provide essentially no structural support, and this limits the use of air or other gases as dielectric materials in integrated circuits. Etches and other manufacturing processes used to produce air gaps in integrated circuits must access small spaces, and many etches can be destructive to electronic components adjacent to the gaps, such as interconnects. The limited space for air gaps makes protective barriers or other protective steps difficult to implement, so the components adjacent to the gaps are often sized larger to withstand some damage from etching during the production of the air gaps. However, the larger size of the components adjacent to the air gaps limits the ability to produce smaller and smaller integrated circuits. The destructive etch effects can also decrease reliability of the integrated circuit.

Accordingly, it is desirable to provide integrated circuits and methods of producing integrated circuits with air gaps while minimizing the size of components adjacent to the air gaps. In addition, it is desirable to provide methods of production that utilize air gaps but still produce an integrated circuit with sufficient solid material for structural stability. Furthermore, other desirable features and characteristics of the present embodiment will become apparent from the subsequent detailed description and the appended claims, taken in conjunction with the accompanying drawings and this background of the invention.

BRIEF SUMMARY

Integrated circuits and methods for producing the same are provided. In an exemplary embodiment, a method for producing an integrated circuit includes forming an interconnect trench in a dielectric layer, and forming a conformal barrier layer overlying the dielectric layer and within the interconnect trench. A barrier spacer is formed by removing the conformal barrier layer from an interconnect trench bottom, and an interconnect is formed within the interconnect trench after forming the barrier spacer. An air gap trench is formed in the dielectric layer adjacent to the barrier spacer, and a top cap is formed overlying the interconnect and the air gap trench, where the top cap bridges the air gap trench to produce an air gap in the air gap trench.

A method for producing an integrated circuit is provided in another embodiment. Adjacent interconnect trenches are formed in a dielectric layer, and a barrier spacer is formed within the adjacent interconnect trenches. Adjacent interconnects are formed within the adjacent interconnect trenches after forming the barrier spacer, where the adjacent interconnects contact the barrier spacer on an interconnect side wall and the dielectric layer on an interconnect bottom. An air gap is formed between the adjacent interconnects where the air gap is defined by the barrier spacer, the dielectric layer, and a top cap.

An integrated circuit is provided in yet another embodiment. The integrated circuit includes adjacent interconnects embedded within a dielectric layer, where each of the adjacent interconnects includes an interconnect side wall. A barrier spacer is embedded in the dielectric layer and contacts the interconnect side wall. A top cap overlies the adjacent interconnects. An air gap is defined by the dielectric layer at an air gap bottom end, the barrier spacer, and the top cap.

BRIEF DESCRIPTION OF THE DRAWINGS

The present embodiments will hereinafter be described in conjunction with the following drawing figures, wherein like numerals denote like elements, and wherein.

DETAILED DESCRIPTION

Figure 1:
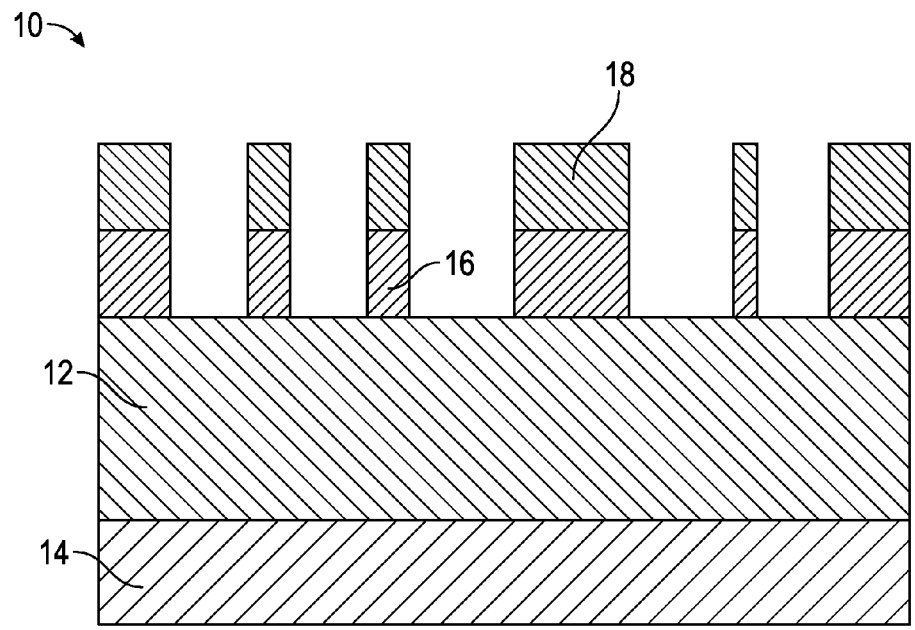
FIGS. 1-9 illustrate, in cross sectional views, a portion of an integrated circuit and methods for its fabrication in accordance with exemplary embodiments.

The following detailed description is merely exemplary in nature and is not intended to limit the various embodiments or the application and uses thereof. Furthermore, there is no intention to be bound by any theory presented in the preceding background or the following detailed description.

An integrated circuit includes interconnects embedded in a dielectric layer overlying a substrate, with air gaps defined between adjacent interconnects. In some embodiments, an interconnect trench is etched into the dielectric layer, and barrier spacers are formed along the interconnect trench side walls. The interconnect trench is within the dielectric layer such that the interconnect trench does not contact a lower device. Interconnects are formed in the interconnect trench, and the dielectric layer is etched from between adjacent interconnects in desired areas to form an air gap trench. A top cap is then formed over the dielectric layer, where the top cap bridges the air gap trench to form air gaps between adjacent interconnects. The interconnects are electrically insulated by the adjacent air gaps, the underlying dielectric layer, and the overlying top cap. The interconnects are protected from the air gap trench etch by the barrier spacer.

An exemplary embodiment of a method of producing an integrated circuit will now be described with reference to FIGS. 1-9. An integrated circuit 10 includes a dielectric layer 12 overlying a lower device 14. The integrated circuit 10 may also include a dielectric cap layer (not illustrated) underlying the dielectric layer 12 to limit metal diffusion into the dielectric layer 12. The dielectric cap layer, if present, may be silicon nitride, silicon oxynitride, etc., and it may be removed for electrical connections as needed, as understood by those skilled in the art. The dielectric layer 12 may include silicon dioxide, silicon nitride, silicon carbon nitride, or another insulating material, including a high K dielectric material or a combination of the aforementioned materials. As used herein, a "high K dielectric" is a dielectric material with a dielectric constant (K) of about 3.7 or greater, where K is the ratio of a material's permittivity $\in$ to the permittivity of vacuum $\in_0$, so $k=\in/\in_0$. Since the dielectric constant is just a ratio of two similar quantities, it is dimensionless. In many embodiments, the dielectric layer 12 has a relatively low dielectric constant, such as about 4.2 or less. As referred to herein, when a recited feature "includes" a recited material, it is intended to mean that the recited material is present in the recited feature in an amount of at about 50 weight % or more, and may be present at about 100 weight %, based on the entire weight of the recited feature. The dielectric layer 12 is formed using methods well known to those skilled in the art, such as chemical vapor deposition or other deposition processes appropriate to deposit the material of the dielectric layer 12. In an exemplary embodiment, the lower device 14 is an interconnect at a level below the dielectric layer 12. However, in alternate embodiments, the lower device 14 may include one or more electronic components like transistors and capacitors, a substrate, a conductive plate, or a wide variety of other components (not specifically illustrated) used in integrated circuits 10.

In some embodiments, the lower device 14 may overlie a substrate (not illustrated) or may be part of the substrate in various embodiments. As used herein, the term "substrate" will be used to encompass semiconductor materials conventionally used in the semiconductor industry from which to make electrical devices. Semiconductor materials include monocrystalline silicon materials, such as the relatively pure or lightly impurity-doped monocrystalline silicon materials typically used in the semiconductor industry, as well as polycrystalline silicon materials, and silicon admixed with other elements such as germanium, carbon, and the like. Semiconductor material also includes other materials such as relatively pure and impurity-doped germanium, gallium arsenide, zinc oxide, glass, and the like. In an exemplary embodiment, the semiconductor material is a monocrystalline silicon substrate. The silicon substrate may be a bulk silicon wafer or may be a thin layer of silicon on an insulating layer (commonly known as silicon-on-insulator or SOI) that, in turn, is supported by a carrier wafer.

A trench hard mask 16 is formed overlying the dielectric layer 12 in an exemplary embodiment. The trench hard mask 16 may include silicon nitride, and the silicon nitride may be deposited by low pressure chemical vapor deposition using ammonia and dichlorosilane. In alternate embodiments, the trench hard mask 16 may be titanium nitride or other materials. A trench photoresist 18 is then spin cast overlying the trench hard mask 16, and the trench photoresist 18 and trench hard mask 16 are patterned to expose a top surface of the dielectric layer 12 at desired locations, such as locations where interconnects are to be formed. The trench hard mask 16 and trench photoresist 18 may be repeatedly formed and removed for repeated etchings of trenches of varying depth or for trenches that are spaced too close together for the lithographic resolution by a single exposure. The trench photoresist 18 and trench hard mask 16 are removed after a trench etch (described below), such as with an oxygen containing plasma for the trench photoresist 18 and a wet etch with hot phosphoric acid for the trench hard mask 16.

Figure 2:
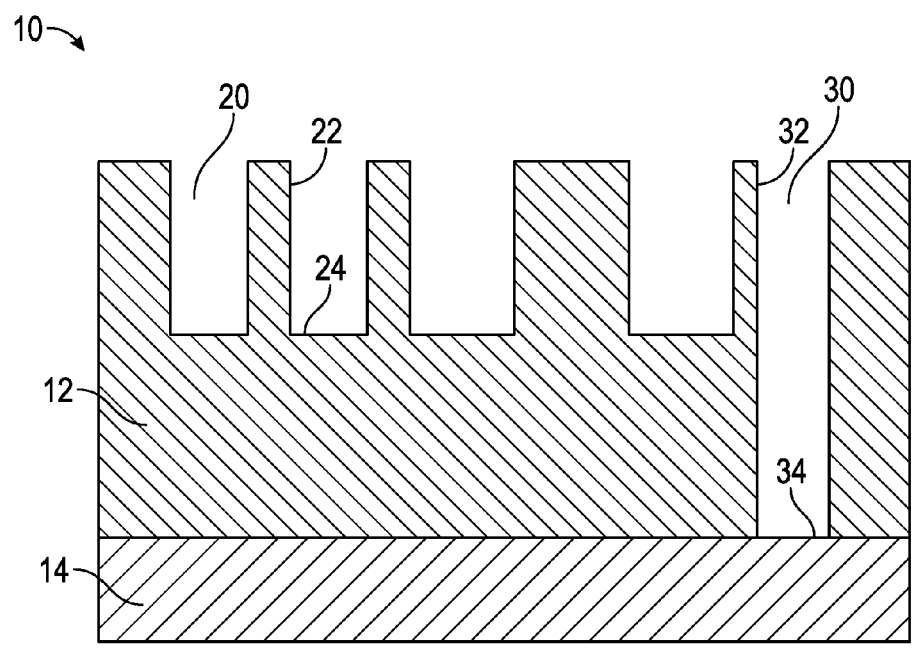

Referring to the exemplary embodiment in FIG. 2 with continuing reference to FIG. 1, an interconnect trench 20 and a via trench 30 are etched in the dielectric layer 12 at selected locations when the trench hard mask 16 is in place. FIG. 2 illustrates the integrated circuit 10 after the trench hard mask 16 and the trench photoresist 18 have been removed. The interconnect trench 20 extends into the dielectric layer 12, but does not penetrate the dielectric layer 12, whereas the via trench 30 penetrates the dielectric layer 12 and exposes a portion of the lower device 14. In some embodiments, the via trench 30 uses a second lithography and etching process for the greater depth, relative to the interconnect trench 20. In an exemplary embodiment with the dielectric layer 12 including silicon dioxide, the interconnect trench 20 and the via trench 30 are formed by a reactive ion etch using trifluoromethane or other appropriate chemistries, and the interconnect trench 20 and the via trench 30 may be formed with separate etches for the varying depths.

The interconnect trench 20 includes an interconnect trench side wall 22 and an interconnect trench bottom 24 within the dielectric layer 12, where the interconnect trench side walls 22 are generally vertical and on opposite sides of the interconnect trench 20, and the interconnect bottom 24 is generally horizontal and at the bottom of the interconnect trench 20. The via trench 30 similarly includes a via trench side wall 32 and a via trench bottom 34, where the via trench side wall 32 is formed from the dielectric layer 12 and the via trench bottom 34 is at the lower device 14. In an exemplary embodiment, a plurality of interconnect trenches 20 are formed with interconnect trenches 20 adjacent to each other, and the distance between adjacent interconnect trenches 20 can vary from one location to another.

A barrier spacer is then formed in the interconnect trench 20. In an exemplary embodiment and referring to FIG. 3, the barrier spacer is formed by forming a conformal barrier layer 36 within the interconnect trench 20, the via trench 30, and overlying the dielectric layer 12. The conformal barrier layer 36 should be resistant to etches selective to the material of the dielectric layer 12, and the conformal barrier layer 36 should be a dielectric material. For example, the conformal barrier layer 36 may include silicon nitride deposited by atomic layer deposition using ammonia and silane, but other materials or conformal deposition techniques may be used in alternate embodiments. The conformal barrier layer 36 is conformally deposited such that it generally has a constant thickness within the interconnect trench 20, the via trench 30, and overlying the dielectric layer 12. For example a conformal barrier layer thickness may not vary by more than about 75% in an exemplary embodiment.

Figure 3:
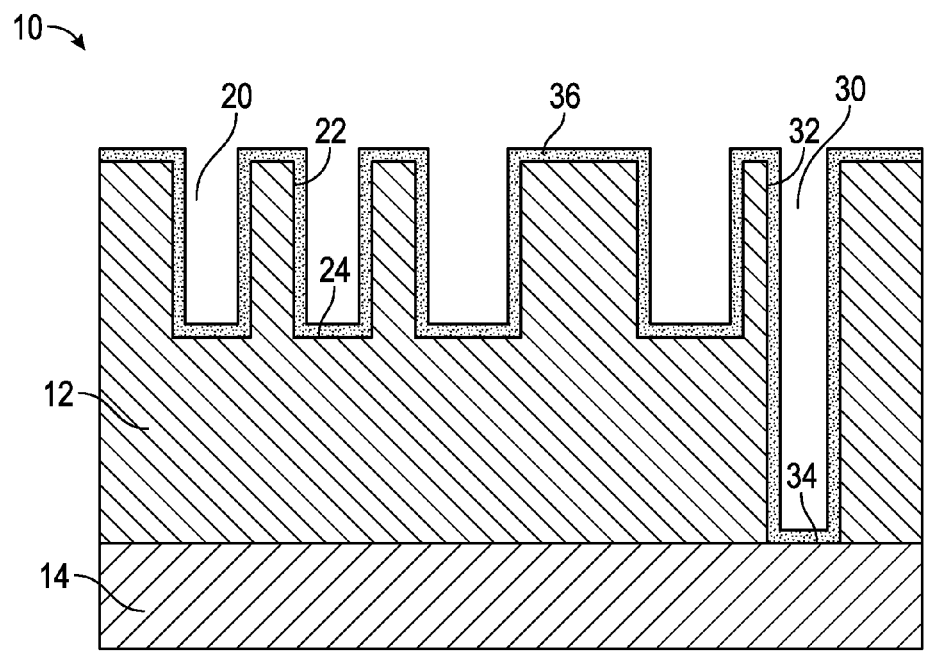
Figure 4:
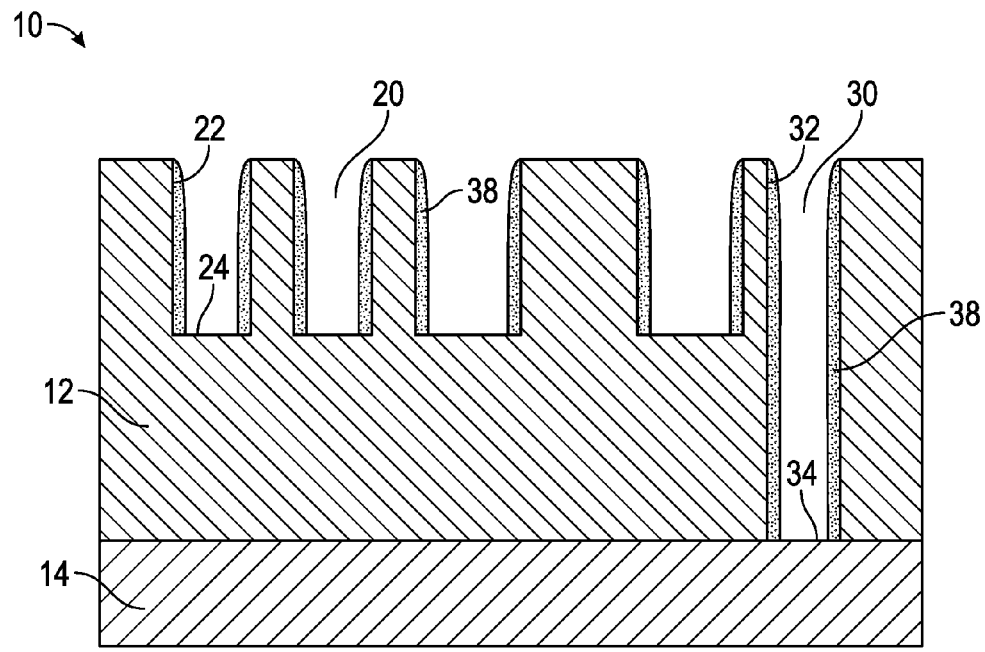

Referring to the exemplary embodiment illustrated in FIG. 4, with continuing reference to FIG. 3, the conformal barrier layer 36 is anisotropically etched to form barrier spacers 38 on the vertical surfaces of the dielectric layer 12, so the barrier spacers 38 are embedded in the dielectric layer 12. For example, a reactive ion etch with silicon hexafluoride will remove the conformal barrier layer 36 in embodiments where the conformal barrier layer 36 includes silicon nitride. The etching terminates when the horizontal portions of the conformal barrier layer 36 are substantially removed, so only the vertical portions remain. This produces the barrier spacer 38 on the interconnect trench side wall 22 and the via trench side wall 32, but the dielectric layer 12 at the interconnect trench bottom 24 and the lower device 14 at the via trench bottom 34 are exposed. A top surface of the dielectric layer 12 between adjacent interconnect trenches 20 and via trenches 30 is also exposed.

Figure 5:
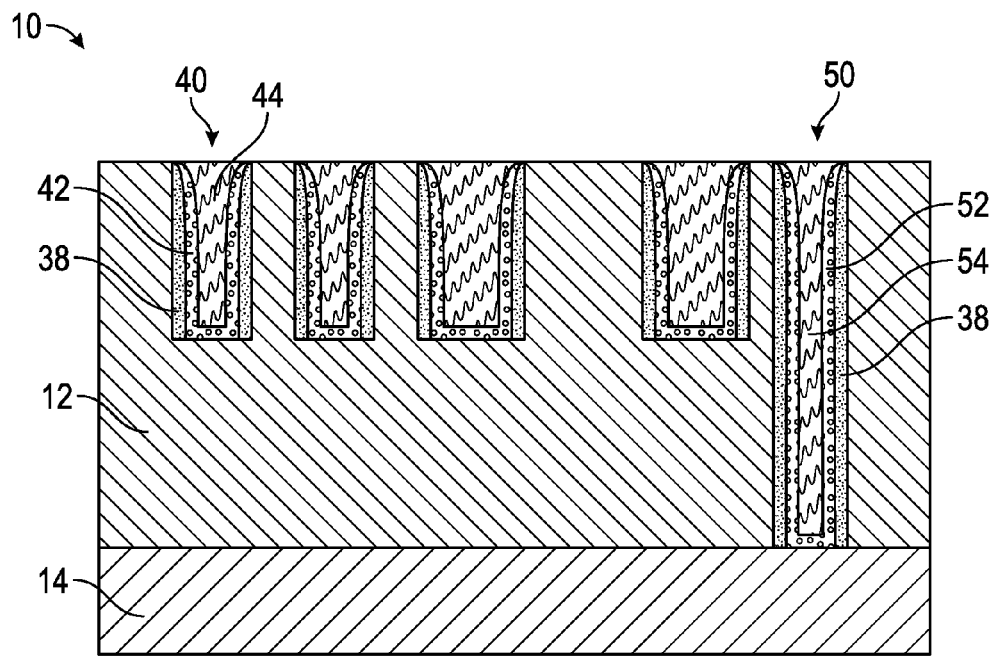

An interconnect 40 and a via 50 are formed in the interconnect trench 20 and the via trench 30, respectively, as illustrated in FIG. 5 with continuing reference to FIG. 4. As such, the interconnect 40 and the via 50 are embedded within the dielectric layer 12. In an exemplary embodiment, the interconnect 40 and the via 50 are formed at the same time. The interconnect 40 and the via 50 are formed from electrically conductive materials, such as copper, and may be formed by the damascene or dual damascene process. In an exemplary embodiment, the interconnect 40 may include an interconnect barrier and liner layer 42 and an interconnect core 44, and the via 50 may include a via barrier and liner layer 52 and a via core 54. The interconnect and via barrier and liner layers 42, 52 may improve adhesion of the interconnect and via cores 44, 54 to dielectric materials, and may improve reliability. The interconnect and via barrier and liner layers 42, 52 may be tantalum nitride/tantalum (TaN/Ta), tantalum nitride/cobalt (TaN/Co), tantalum nitride/ruthenium (TaN/Ru), copper alloys, or other materials, (and solutes such as manganese, aluminum, tantalum, titanium, and/or other metals), which can be deposited by physical vapor deposition. The interconnect and via cores 44, 54 may then be formed, where the interconnect and via cores 44, 54 may be formed by a physical vapor deposition sputtered seed layer (not illustrated), followed by copper electroplating, followed by chemical mechanical planarization to remove the overburden. Alternatively, the interconnect and via cores 44, 54 may be a physical vapor deposition copper reflow process, as understood by those skilled in the art. The interconnect and via cores 44, 54 may include about 90 mass percent or more copper in some embodiments, but various copper alloys can be used, some of which may include less than 90 mass percent copper. In other embodiments, the interconnect and via cores 44, 54 may be a conductive material other than copper, and the interconnect and via barrier and liner layers 42, 52 may be different or non-existent in alternate embodiments. Iodine (not illustrated) may optionally be deposited on the interconnect and via barrier and liner layers 42, 52 before the interconnect and via cores 44, 54 are formed to help prevent or minimize the formation of voids. In an exemplary embodiment, ethyl iodine vapor is fed directly over the interconnect and via barrier and liner layers 42, 52 and the integrated circuit 10 without a carrier gas, and thereby deposited.

Figure 6:
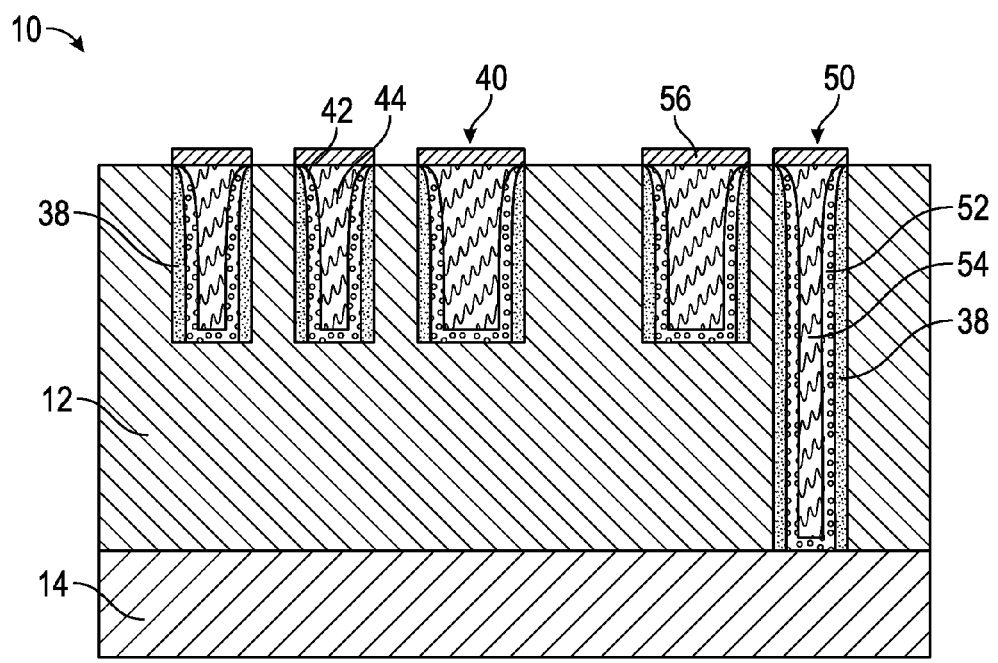

Reference is made to the exemplary embodiment illustrated in FIG. 6. A metallic hard mask 56 is formed overlying the interconnect 40 and the via 50 for protection during future etches. The metallic hard mask 56 may be formed by a selectively depositing a material that includes a metal, such as aluminum nitride or cobalt. The selective deposition forms the metallic hard mask 56 on the exposed metal top surfaces of the interconnect 40 and the via 50, but the selective deposition does not deposit material on the non-metallic dielectric layer 12. In an exemplary embodiment, the selective deposition is a vapor deposition using tricarbonyl allyl cobalt to form a cobalt metallic hard mask 56.

Referring now to the exemplary embodiment in FIG. 7, a block layer 58 is formed overlying the dielectric layer 12 where air gaps (described below) are not desired. Air gaps do not provide structural support, so air gaps are only formed where a very low dielectric constant is needed to separate components (such as interconnects 40) that are spaced close together. In an exemplary embodiment, the block layer 58 is used to control the location of the air gaps. In an exemplary embodiment, the block layer 58 is a photoresist layer that is patterned to cover the desired areas while exposing the top surface of the dielectric layer 12 where air gaps are to be formed. The block layer 58 is patterned to cover the via 50 and the top surface of the dielectric layer 12 between the vias 50 and an adjacent interconnect 40. The block layer 58 may also cover the dielectric layer 12 between adjacent interconnects 40 where the distance between the adjacent interconnects 40 is larger than desired for the air gap, because the distance may be too large to form an air gap. In an exemplary embodiment, the block layer 58 covers the top surface of the dielectric layer 12 between adjacent interconnects 40 where the distance between the adjacent interconnects 40 is about 40 nanometers or greater, or about 50 nanometers or greater, or about 70 nanometers or greater, or about 150 nanometers or greater in various embodiments. The block layer 58 may also cover the top surface of the dielectric layer 12 between adjacent interconnects 40 where the distance between the interconnects 40 is less than about 40 nanometers for various design reasons, such as if the integrated circuit 10 does not require a very low dielectric constant between the interconnects 40, or if a particular location requires more structural integrity than provided by an air gap, or if a via from an upper level (not illustrated) is intended to land at that location.

Figure 7:
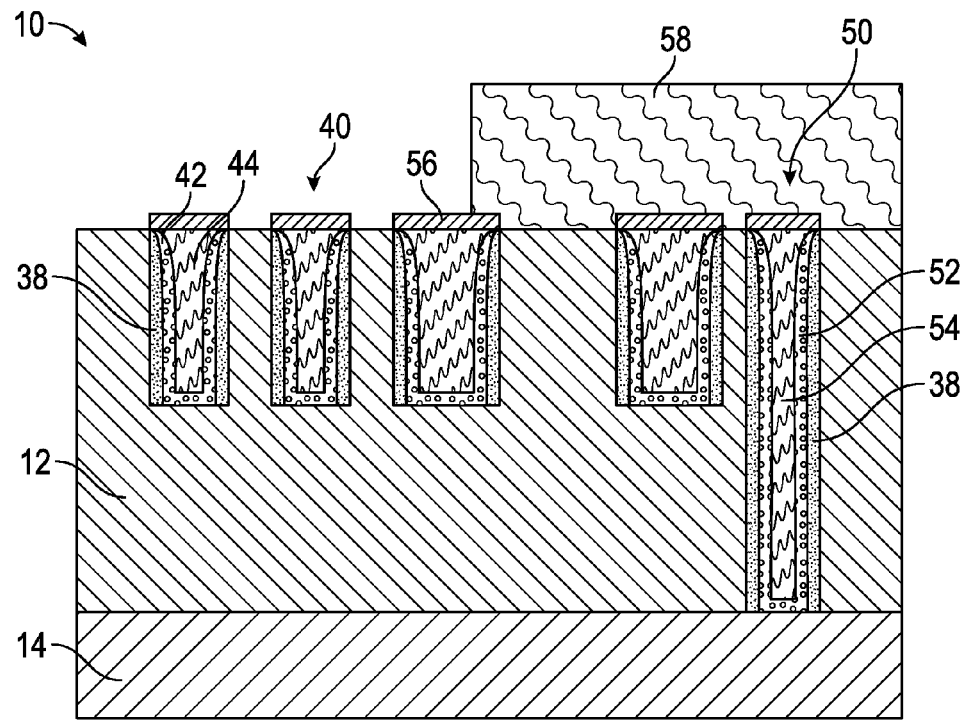
Figure 8:
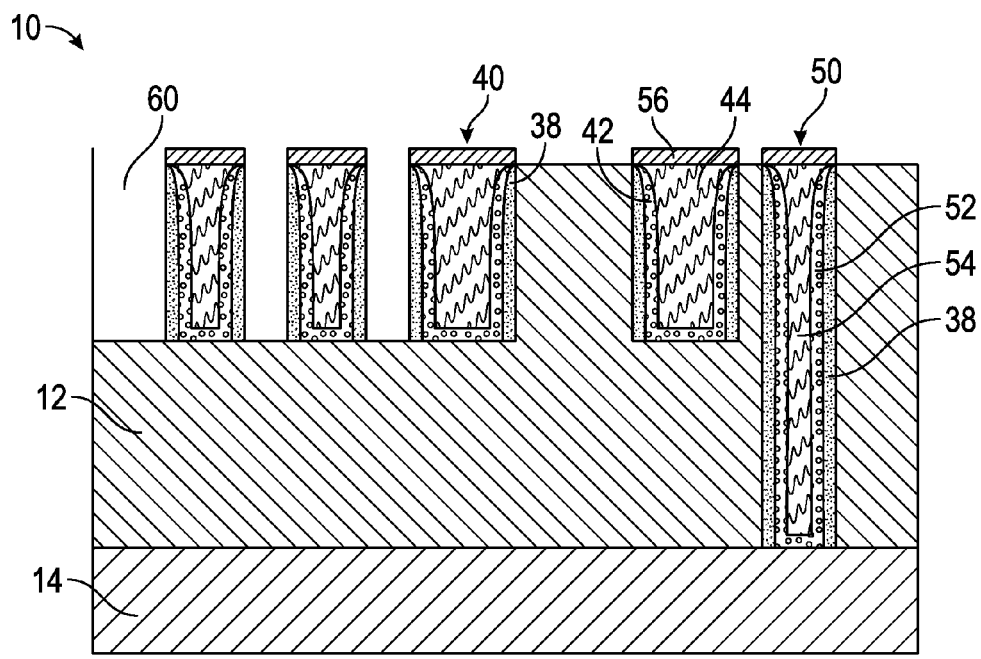

An air gap trench 60 is formed between selected adjacent interconnects 40, as illustrated in an exemplary embodiment in FIG. 8 with continuing reference to FIG. 7. As such, the air gap trench 60 is formed adjacent to the barrier spacer 38, so the barrier spacer 38 is positioned between the air gap trench 60 and the interconnect 40. The air gap trench 60 is formed by etching the dielectric layer 12 with an etchant selective to the dielectric layer 12 over the barrier spacer 38 and over the metallic hard mask 56. In an exemplary embodiment with the dielectric layer 12 including silicon dioxide or a dielectric including silicon, carbon, oxygen and hydrogen (SiCOH), the barrier spacer 38 including silicon nitride, and the metallic hard mask 56 including cobalt or aluminum nitride, the air gap trench 60 may be formed by a wet etch with dilute hydrofluoric acid. The air gap trench etch is terminated when the air gap trench 60 extends to about the bottom surface of the interconnect 40, so the air gap trench 60 does not undercut the interconnect 40 and thereby reduce the structural stability of the interconnect 40 beyond actable limits. The block layer 58 is formed before etching the air gap trench 60, and the block layer 58 remains in place when etching the air gap trench 60, so the block layer 58 prevents the formation of an air gap trench 60 in undesired locations, such as adjacent to the via 50 as described above. The block layer 58 can be removed after the air gap trench 60 is formed, such as with an oxygen containing plasma.

Figure 9:
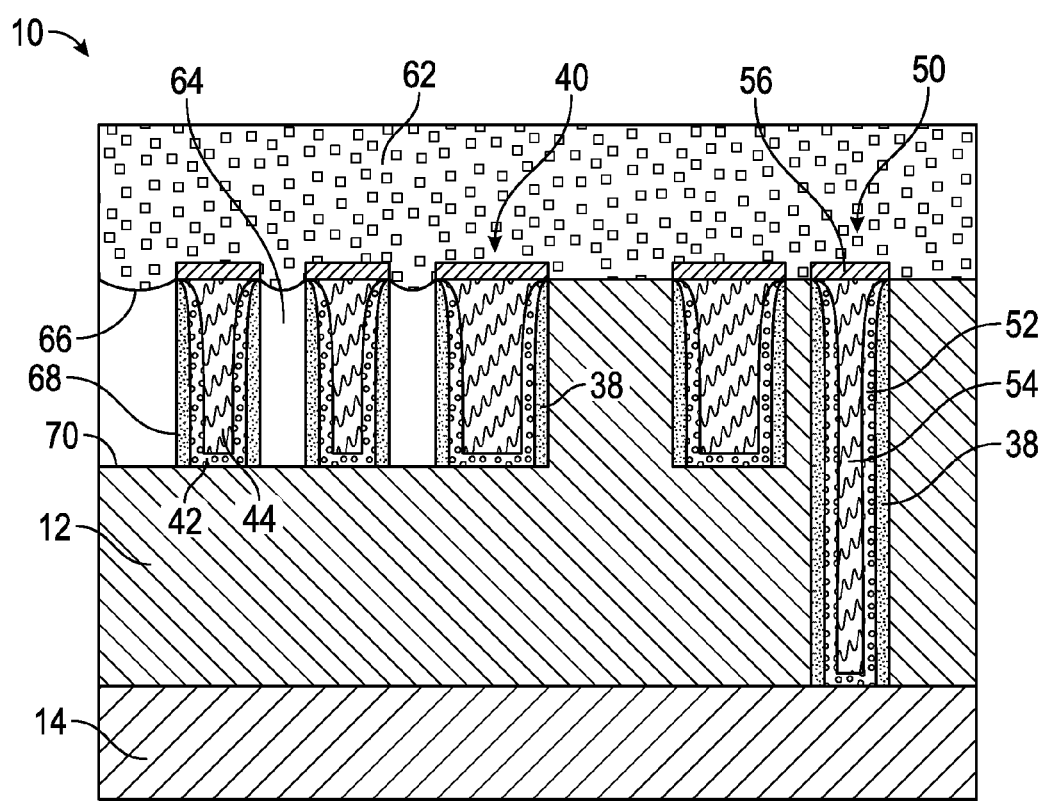

Reference is made to the exemplary embodiment illustrated in FIG. 9. A top cap 62 is formed overlying the air gap trench 60 to produce an air gap 64 within the air gap trench 60. The air gap 64 is defined by the top cap 62 at an air gap upper end 66, the barrier spacers 38 at an air gap side 68, and the dielectric layer 12 at an air gap bottom end 70. In an exemplary embodiment, the air gap 64 is defined by only the top cap 62, the barrier spacers 38, and the dielectric layer 12. The top cap 62 is formed by non-conformal deposition such that the top cap 62 bridges the air gap trench 60 at the air gap upper end 66, such as by plasma enhanced chemical vapor deposition. The top cap 62 is a dielectric insulator and may include materials such as silicon carbon nitride, silicon nitride, or silicon oxynitride in various embodiments. Silicon nitride can be deposited using ammonia and silane, silicon oxynitride can be deposited using nitrous oxide and silane, and silicon carbon nitride can be deposited using ammonia and poly dimethyl silane, but other deposition methods, top cap materials, or deposition chemistries can be used in other embodiments.

The top cap 62 must bridge the air gap upper end 66, so the distance between adjacent interconnects 40 has to be small enough that the top cap 62 bridges the air gap trench 60 instead of filling it in. The distance between adjacent interconnects 40 on opposite sides of the air gap trench 60 may be from about 150 to about 5 nanometers, or from about 50 nanometers to about 5 nanometers, or from about 40 nanometers to about 5 nanometers, or from about 32 nanometers to about 5 nanometers in various embodiments. The top cap 62 may intrude into the air gap trench 60 somewhat and still form an air gap 64, so the air gap trench 60 should have a sufficient aspect ratio to prevent the top cap 62 from filling in the air gap trench 60. For example, if the aspect ratio was about 0.2 or less, the top cap 62 would likely fill the air gap trench 60 and no air gap 64 would be formed. The air gap trench 60 has an aspect ratio of about 1.5 or more, or about 2 or more, or about 3 or more in various embodiments.

The air gap 64 can be formed in an air atmosphere, so air fills the air gap 64. In alternate embodiments, the air gap 64 can be formed in a vacuum, or in a helium, nitrogen, argon, xenon, or other atmosphere, so different gases or a vacuum can be trapped in the air gap 64. The gas in the air gap 64 is a non-polar gas in many embodiments. In some embodiments, a "quenching gas" may be used to reduce the risk of catastrophic electrical discharges, where exemplary quenching gases include, but are not limited to, perfluorocarbons or chlorofluorocarbons. A pressure of about 1 atmosphere in the air gap 64 may reduce stress on the integrated circuit 10, so there is little pressure differential to drive gases to escape or enter the air gap 64 when used at or near atmospheric pressure. However, higher or lower pressures may be used in alternate embodiments. The production process described above protects the interconnect 40 from the etch for the air gap trench 60 with the barrier spacer 38, yet allows for an electrical connection between the via 50 and the lower device 14. The interconnects 40, via 50, and air gaps 64 are incorporated into the integrate circuit 10, as understood by those skilled in the art.

While at least one exemplary embodiment has been presented in the foregoing detailed description, it should be appreciated that a vast number of variations exist. It should also be appreciated that the exemplary embodiments are only examples, and are not intended to limit the scope, applicability, or configuration of the application in any way. Rather, the foregoing detailed description will provide those skilled in the art with a convenient road map for implementing one or more embodiments, it being understood that various changes may be made in the function and arrangement of elements described in an exemplary embodiment without departing from the scope, as set forth in the appended claims.

What is claimed is:

1. A method of producing an integrated circuit comprising:
    forming an interconnect trench in a dielectric layer, wherein the interconnect trench comprises an interconnect trench bottom;
    forming a conformal barrier layer overlying the dielectric layer and within the interconnect trench;
    forming a barrier spacer by removing the conformal barrier layer from the interconnect trench bottom such that the dielectric layer contacts the barrier spacer at an interconnect trench side wall;
    forming an interconnect within the interconnect trench after forming the barrier spacer such that the same dielectric layer that contacts the barrier spacer contacts the interconnect at the interconnect trench bottom;
    forming an air gap trench in the dielectric layer adjacent to the barrier spacer; and
    forming a top cap overlying the interconnect and the air gap trench, wherein the top cap bridges the air gap trench to produce an air gap in the air gap trench.

2. The method of claim 1 further comprising:
    forming a metallic hard mask overlying the interconnect before forming the air gap trench.

3. The method of claim 2 wherein forming the metallic hard mask comprises selectively depositing a metallic material.

4. The method of claim 1 wherein forming the interconnect comprises forming an interconnect core, wherein the interconnect core comprises about 90 mass percent copper or more.

5. The method of claim 1 wherein forming the conformal barrier layer comprises:
    conformally depositing silicon nitride by atomic layer deposition.

6. The method of claim 1 further comprising:
    forming a via trench within the dielectric layer; and
    forming a via within the via trench, wherein the via makes an electrical connection with a lower device underlying the dielectric layer.

7. The method of claim 6 wherein forming the via comprises forming the via and forming the interconnect at the same time.

8. The method of claim 6 further comprising:
    forming a block layer overlying the dielectric layer between the via and an adjacent interconnect, wherein the adjacent interconnect is adjacent to the via.

9. The method of claim 8 wherein forming the block layer comprises forming the block layer from photoresist.

10. The method of claim 1 wherein forming the air gap trench comprises etching the air gap trench between adjacent interconnects, wherein a distance between the adjacent interconnects is about 32 nanometers or less.

11. The method of claim 1 further comprising forming a block layer that covers the dielectric layer between adjacent interconnects wherein a distance between the adjacent interconnects is about 40 nanometers or more.

12. The method of claim 1 wherein forming the air gap trench comprises etching the air gap trench with an air gap trench aspect ratio of about 1.5 or greater.

13. The method of claim 1 wherein forming the top cap comprises forming the top cap by plasma enhanced chemical vapor deposition.

14. The method of claim 13 wherein forming the top cap comprises depositing silicon carbon nitride, silicon nitride, silicon oxynitride, or combinations thereof to form the top cap.

15. A method of producing an integrated circuit comprising:
    forming adjacent interconnect trenches in a dielectric layer;
    forming a barrier spacer within the adjacent interconnect trenches;
    forming adjacent interconnects within the adjacent interconnect trenches after forming the barrier spacer, wherein each of the adjacent interconnects comprises an interconnect side wall and an interconnect bottom, wherein each of the adjacent interconnects contacts the barrier spacer on the interconnect side wall and each of the adjacent interconnects contacts the dielectric layer on the interconnect bottom;

forming an air gap between the adjacent interconnects wherein the air gap is defined by only the barrier spacer, the dielectric layer, and a top cap.

16. The method of claim 15 further comprising:
etching an air gap trench between the adjacent interconnects, wherein a distance between the adjacent interconnects is about 32 nanometers or less.

17. The method of claim 16 wherein forming the adjacent interconnects comprises forming a plurality of adjacent interconnects, the method further comprising:
forming a block layer before etching the air gap trench, wherein the block layer overlies the dielectric layer between the adjacent interconnects wherein the distance between the adjacent interconnects is about 40 nanometers or more such that a top surface of the dielectric layer where the air gap is to be formed is exposed; and
removing the block layer after etching the air gap trench.

18. The method of claim 15 further comprising:
forming the top cap overlying the air gap and the adjacent interconnects, wherein the top cap is formed by plasma enhanced chemical vapor deposition such that the top cap bridges an air gap trench to form the air gap.

19. The method of claim 15 wherein forming the barrier spacer comprises forming the barrier spacer such that the dielectric layer contacts the barrier spacer at an interconnect trench side wall and wherein forming the adjacent interconnects comprises forming the adjacent interconnects such that the same dielectric layer that contacts the barrier spacer contacts the adjacent interconnects at the interconnect bottom.

* * * * *